United States Patent
Sundararajan et al.

(10) Patent No.: US 8,626,481 B1
(45) Date of Patent: Jan. 7, 2014

(54) SIGNAL TAGGING DURING SIMULATION

(75) Inventors: Arvind Sundararajan, Sunnyvale, CA (US); Jingzhao Ou, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 944 days.

(21) Appl. No.: 12/756,775

(22) Filed: Apr. 8, 2010

(51) Int. Cl.
*G06F 17/50* (2006.01)

(52) U.S. Cl.
USPC .............................. 703/14; 703/13

(58) Field of Classification Search
None
See application file for complete search history.

(56) References Cited

U.S. PATENT DOCUMENTS 5,155,836 A * 10/1992 Jordan et al. ................. 703/23
5,367,468 A * 11/1994 Fukasawa et al. ............ 716/102
2007/0271499 A1 * 11/2007 Feng et al. .................... 715/502

OTHER PUBLICATIONS

U.S. Appl. No. 12/337,901, filed Dec. 18, 2008, Esser et al.

* cited by examiner

*Primary Examiner* — Thai Phan
*Assistant Examiner* — Herng-Der Day
(74) *Attorney, Agent, or Firm* — LeRoy D. Maunu

(57) ABSTRACT

Approaches for simulating a circuit design. A block diagram of the circuit design is displayed. Each block has at least one input and at least one output, and at least one of the input or output of each block is connected to another block. Simulation data are input to a simulation model of the circuit design. During simulation of each of a plurality of the sub-circuits with the simulation model, an output data value is determined from one or more input data values to the simulated sub-circuit. Concurrent with determining the output data value, an output tag value corresponding to the output data value is determined. Concurrent with output of the output data value from the simulated sub-circuit, each output tag value is displayed proximate an output signal line from the block corresponding to the sub-circuit.

19 Claims, 7 Drawing Sheets

SIGNAL TAGGING DURING SIMULATION

FIELD OF THE INVENTION

The present invention generally relates to simulating an electronic circuit design and providing a view of tagged signals relative to a bock diagram of the circuit design.

BACKGROUND

Electronic circuits are simulated during the design process for purposes of verifying correct behavior and debugging the design if errors are found. The data generated during simulation of the design is typically depicted with a wave form viewer. A waveform viewer generally shows how the value of a signal changes relative to clock cycles during the simulation. The information provided by the waveform viewer is helpful and perhaps necessary to tracing the source of a problem in a design. Debugging the design may require measurement of signal latency and determining the flow and effect of data through the system. However, cross-referencing the signals and relating signal values in a waveform viewer to the logic blocks of the design may be challenging and time-consuming.

The present invention may address one or more of the above issues.

SUMMARY

The embodiments of the present invention provide methods and apparatus for simulating a circuit design. In one embodiment, a method includes displaying a block diagram of the circuit design. Each block corresponds to one of a plurality of sub-circuits of the circuit design, and each block has at least one input and at least one output. At least one of the input or output of each block is connected to another block. Simulation data are input to a simulation model of the circuit design. During simulation on a computer system of each of a plurality of the sub-circuits with the simulation model, an output data value is determined from one or more input data values to the simulated sub-circuit. Concurrent with determining the output data value, the method determines an output tag value corresponding to the output data value. Concurrent with output of the output data value from the simulated sub-circuit, each output tag value is displayed proximate an output signal line from the block corresponding to the sub-circuit.

In another embodiment, the determining of the output tag value determines the output tag value as a function of one or more input tag values associated with the one or more input data values.

For a sub-circuit that is a data storage element, in another embodiment the determining of the output tag value includes assigning a NULL value to the output tag value in response to a reset of the simulated data storage element. For an output tag value that is NULL, the displaying includes not displaying an output tag value proximate the output signal line from the block corresponding to the data storage element.

The determining of the output tag value, in another embodiment, determines the output tag value to be a union of two or more input tag values associated with the one or more input data values.

In another embodiment, the outputs of the plurality of sub-circuits have associated output tag values. The method further includes initializing the output tag values associated with the outputs of the plurality of sub-circuits to NULL values. An output tag value from a first simulated sub-circuit is an input tag value to a second simulated sub-circuit that is connected to the first simulated sub-circuit. For an output tag value that is NULL for a simulated sub-circuit, the displaying includes not displaying an output tag value proximate the output signal line from the block corresponding to the simulated sub-circuit.

The union of a first input tag value that is non-NULL and a second input tag value that is NULL is the non-NULL value in another embodiment.

In yet another embodiment, the union of a third input tag value that is non-NULL and a fourth input tag value that is non-NULL is a fifth non-NULL value that is not equal to either the third or fourth non-NULL values. A mapping of the fifth non-NULL value to the third and fourth non-NULL values is stored.

The determining of the output tag value, in another embodiment, includes invoking a function associated with the output of the sub-circuit when the output data value is determined during simulation. The associated function generates the output tag value as a function of at least one of the input data values.

In another embodiment, the determining of the output tag value for an output designated with default tag handling, determines the output tag value to be a union of two or more input tag values associated with the one or more input data values. The determining of the output tag value for an output of at least one simulated sub-circuit designated with user-defined tag handling, determines the output tag value to be a user-specified value in response to at least one input data value.

A system for simulating a circuit design is provided in another embodiment. The system includes a processor and a memory arrangement coupled to the processor. The memory arrangement is configured with instructions that are executable by the processor. When executed by the processor the instructions cause the processor to perform the operations including displaying a block diagram of the circuit design. Each block corresponds to one of a plurality of sub-circuits of the circuit design, and each block has at least one input and at least one output. At least one of the input or output of each block is connected to another block. Simulation data are input to a simulation model of the circuit design. During simulation of each of a plurality of the sub-circuits with the simulation model, an output data value is determined from one or more input data values to the simulated sub-circuit. Concurrent with determining the output data value, an output tag value corresponding to the output data value is determined. Concurrent with output of the output data value from the simulated sub-circuit, each output tag value is displayed proximate an output signal line from the block corresponding to the sub-circuit.

In another embodiment, an article of manufacture is provided. The article of manufacture includes a processor-readable storage device configured with program instructions that when executed by one or more processors cause the processors to perform operations including displaying a block diagram of the circuit design. Each block corresponds to one of a plurality of sub-circuits of the circuit design, and each block has at least one input and at least one output. At least one of the input or output of each block is connected to another block. Simulation data are input to a simulation model of the circuit design. During simulation of each of a plurality of the sub-circuits with the simulation model, an output data value is determined from one or more input data values to the simulated sub-circuit. Concurrent with determining the data value, an output tag value corresponding to the output data value is determined. Concurrent with output of the output data value from the simulated sub-circuit, each output tag value is displayed proximate an output signal line from the block corresponding to the sub-circuit.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Most designs that are specified in a hardware description language (HDL) contain signal elements and state elements. Signal elements describe the logic and connectivity of the design, and state elements are used to temporally partition the design. In a cycle-accurate simulation, the data associated with the state elements are updated with each clock cycle. The embodiments of the present invention provide methods and systems for simulating a circuit design using tags that are associated with the signal and state elements of the design. The values of the tags are displayed during simulation in combination with a block diagram of the circuit design. As an output value from a block is determined and changed during the simulation, a tag value is displayed near the corresponding signal line of the block diagram. The tagging of signals may be used to observe latency from the occurrence of one signal value to the effect on another signal in the design in the context of a block diagram of the design. The tagging also allows the viewer to observe the occurrence of a wavefront of signal states resulting from a selected signal.

Figure 1:
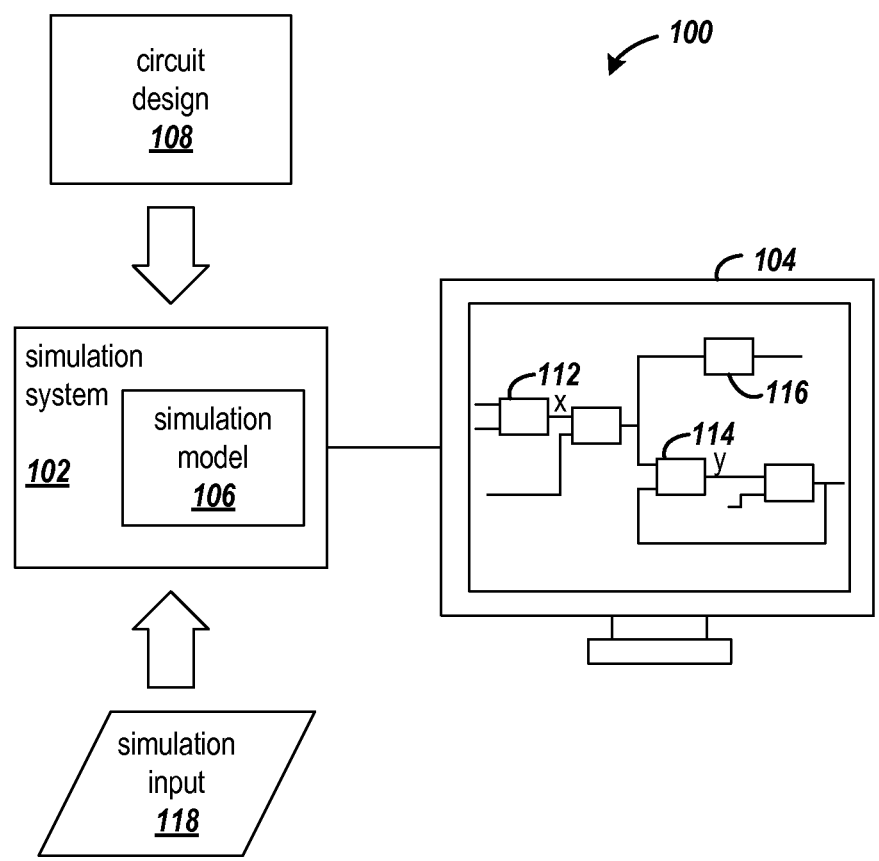
FIG. 1 is a block diagram that shows a simulation arrangement in accordance with an embodiment of the invention.

FIG. 1 is a block diagram that shows a simulation arrangement 100 in accordance with an embodiment of the invention. The simulation arrangement 100 includes simulation system 102, which is coupled to a display device 104. The simulation system constructs a simulation model 106 from an input circuit design 108. During simulation, the simulation system displays a block diagram of the circuit design. The example block diagram includes multiple logic blocks, such as blocks 112, 114, and 116. The simulation is driven with simulation input data 118.

The embodiments of the invention use tags that are associated with signals of the design. The values of the tags are updated during the simulation as the signal states are updated, and the tag values are displayed in combination with a line that represents the associated signal in the block diagram. In the example block diagram, a tag x is displayed near the signal line output from block 112, and the tag y is displayed near the output signal line from block 114. The times at which the tags are displayed correspond to the times during the simulation at which the signal states are updated.

The definition of a tag is accompanied by an algebra for updating the value of the tag, consistent with updating the data field during the simulation. One of three alternatives may be used in updating a tag. One approach is a hand-off scheme, another approach is a data-based application programming interface (API), and a third approach is an object oriented scheme.

According to the hand-off scheme, the tag value associated with an output signal of a block is updated with data that describe the source signals input to the block. This scheme can be used to monitor wavefronts associated with a particular signal. This data tagging approach may also be used to control a debugger to freeze simulation and for debugging data synchronization issues.

In the hand-off scheme, <NULL> is the initial value of all tags. In order to introduce a tag value, a particular block in the design may be configured to generate a tag value based on parameters associated with the block and on the signal values. Alternatively, a tag and tag value could be associated with a signal based on the time of simulation and value of the signal.

A union operation on the tag values associated with two or more input data values to a binary logic operation is performed to produce the output tag value. For example, if the tag values tag_a and tag_b are associated with the two input data values to a logic operation, the output tag value is {tag_a, tag_b}. In order to reduce the memory overhead associated with the tags, the simulation system automatically generates a unique tag value, for example tag_c, and maintains an associative map of the unique tag values and the associated set of tag values. For example, the map would map tag_c to {tag_a, tag_b}. Operations that involve a <NULL> tag value and a non-<NULL> tag value result in a hand-off of the non-<NULL> tag value. For example, if the tag values tag_a and <NULL> are associated with the two input data values to a logic operation, the output tag value is {tag_a, <NULL>}=tag_a. It will be appreciated that the hand-off scheme may be extended for use with operations having more than two inputs so long as n algebra is defined to handle the input tag values. The particular algebra may be selected according to simulation requirements.

In the hand-off scheme, tag values are handed off across storage elements upon either a rising or falling edge of each clock cycle, depending on the simulation environment and whether the start of each cycle of the simulation environment is mapped to the rising edge or falling of a clock. For cycle-accurate simulation, the hand-off of a tag value accounts for any latency of a storage element. For example, if three cycles are required for reading from a RAM memory, the tag hand-off takes a corresponding three cycles. Reset or initialization of a storage element causes the associated tag value to be reset to <NULL>.

In another embodiment, the updating of tag values may use an API approach. In the API approach, an API function is associated with signal and state elements of the design. The API function is called in response to the data representing the signal value or state information being updated by the simulation system over the course of simulation. The API approach may be used to inject a tag value during the simulation by way of dynamically marking a data element with a tag value which can be monitored during simulation. An example use is to detect the presence of an invalid data value and its progression in a feedback loop. In some instances a feedback loop may become unstable when data are processed by the feedback loop multiple times, and an invalid value is generated at certain iteration. It may be extremely difficult to observe when and where this kind of instability occurs using traditional techniques, especially if the number of iterations is large before the next invalid value is generated. Using a data tagging technique, a tag value can be conditionally generated based on whether the value is invalid or not. When the tag value is generated, one can trace back to the original block in the design that generated the invalid value.

Control signals may be dynamically tagged, and the propagation of the tags could be used to observe the activity of parts of a system through the flow of the injected tags. In addition, the existence of such tags may be used to trigger other debugging operations such as simulation freeze.

In the object-oriented approach, the designer specifies an expression that is associated with a signal and that is parsed with each simulation cycle. A tag value is injected into the simulation for the signal based on the evaluation of the expression. The expression may include input and output tag values of the block in combination with input and output data values of the block.

In another embodiment, the simulation system may define a default tag handling scheme, where the user can override the default scheme on selected ones of the state and signal elements. For example, the default scheme could be the hand-off scheme with <NULL> tag values, and the user could define a non-<NULL> tag value on one of the signals. During simulation, the propagation of the non-<NULL> tag value and display on the block diagram would depict the data flow resulting from the tagged signal.

Those skilled in the art will appreciate that various alternative computing arrangements, including one or more processors and a memory arrangement configured with program code, would be suitable for hosting the processes and data structures and implementing the various embodiments of the simulation system 102. In addition, program code that implements the processes may be provided via a variety of computer-readable storage media or delivery channels such as magnetic or optical disks or tapes, electronic storage devices, or as application services over a network.

The simulation system may include one or more processors (not shown) coupled to a memory/storage arrangement (not shown). The architecture of the computing arrangement depends on implementation requirements, as would be recognized by those skilled in the art. The processor may be one or more general purpose processors, or a combination of one or more general purpose processors and suitable co-processors, or one or more specialized processors (e.g., RISC, pipelined, etc.).

The memory/storage arrangement may be hierarchical storage, for example, as is commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor arrangement executes the software stored in memory/storage arrangement, and reads data from and stores data to the memory/storage arrangement according to the processes described above. An operating system (not shown) manages the resources of the computing arrangement.

Figure 2:
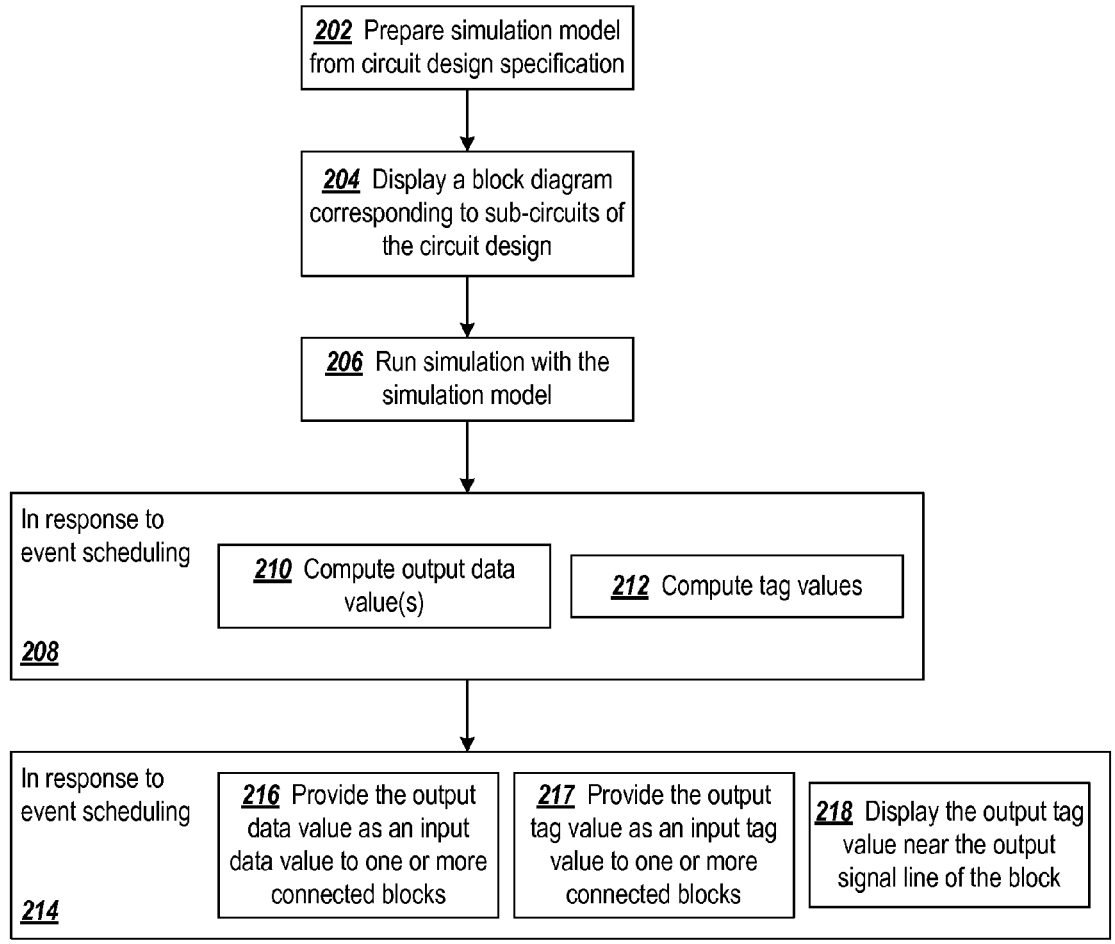
FIG. 2 is a flowchart of a process for simulating a circuit design in accordance with one or more embodiments of the invention.

FIG. 2 is a flowchart of a process for simulating a circuit design in accordance with one or more embodiments of the invention. At step 202, a simulation model is prepared from an input circuit design. The simulation model may be generated using conventional tools adapted to handle tagged signals as described herein. The input specification may include annotations that specify which elements are to be tagged. Alternatively, the elements may be tagged after the simulation model is generated via a graphical user interface, for example.

As part of the simulation, a block diagram of the circuit design is displayed at step 204, and the displaying of the block diagram is concurrent with the running of the simulation at step 206. Each block corresponds to a sub-circuit of the design, and the displayed blocks are connected with lines that represent the signals that pass from one block to another.

As with most simulations, the running of the simulation is event driven. That is, steps 208 and 214 are performed in response to the scheduling of a simulation event. Step 208 illustrates concurrent computation of the output data values (step 210) for one or more sub-circuits of the design and computation of tag values for the sub-circuits (step 212). The computing of a tag value is by one of the methods described above. That is, the tag value may be a hand-off of one or more tag values input to a block, the tag value may be injected by way of an API function that is invoked in response to the state of the simulation at occurrence of the event, or the tag value may be derived from an expression associated with the signal.

Step 214 illustrates concurrent output of data values from one or more simulated sub-circuits of the design and the display of output tag values from the simulated sub-circuits. Output of data and tag values during the simulation are performed in response to a simulation event. At step 216 the simulation provides the output data as an input data value to one or more blocks that are connected to the block providing the output data value. At step 217, the simulation provides the output tag value as an input tag value to the connected blocks. The tag value is displayed near the output signal line of the block providing the output at step 218. The processing of steps 208 and 214 is repeated for subsequently scheduled events of the simulation.

Figure 3:
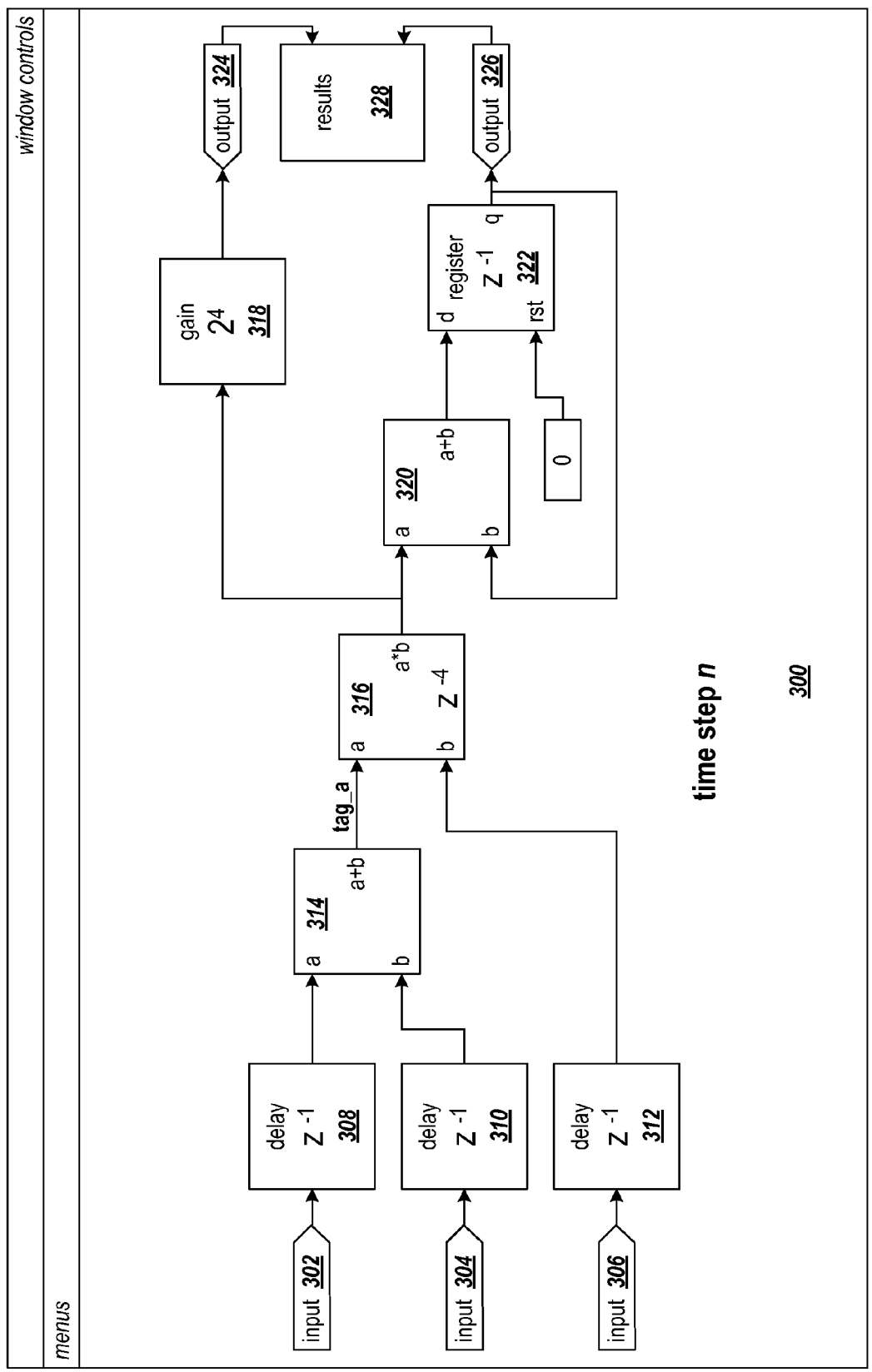
FIG. 3 shows the block diagram during the simulation at time step n.
Figure 4:
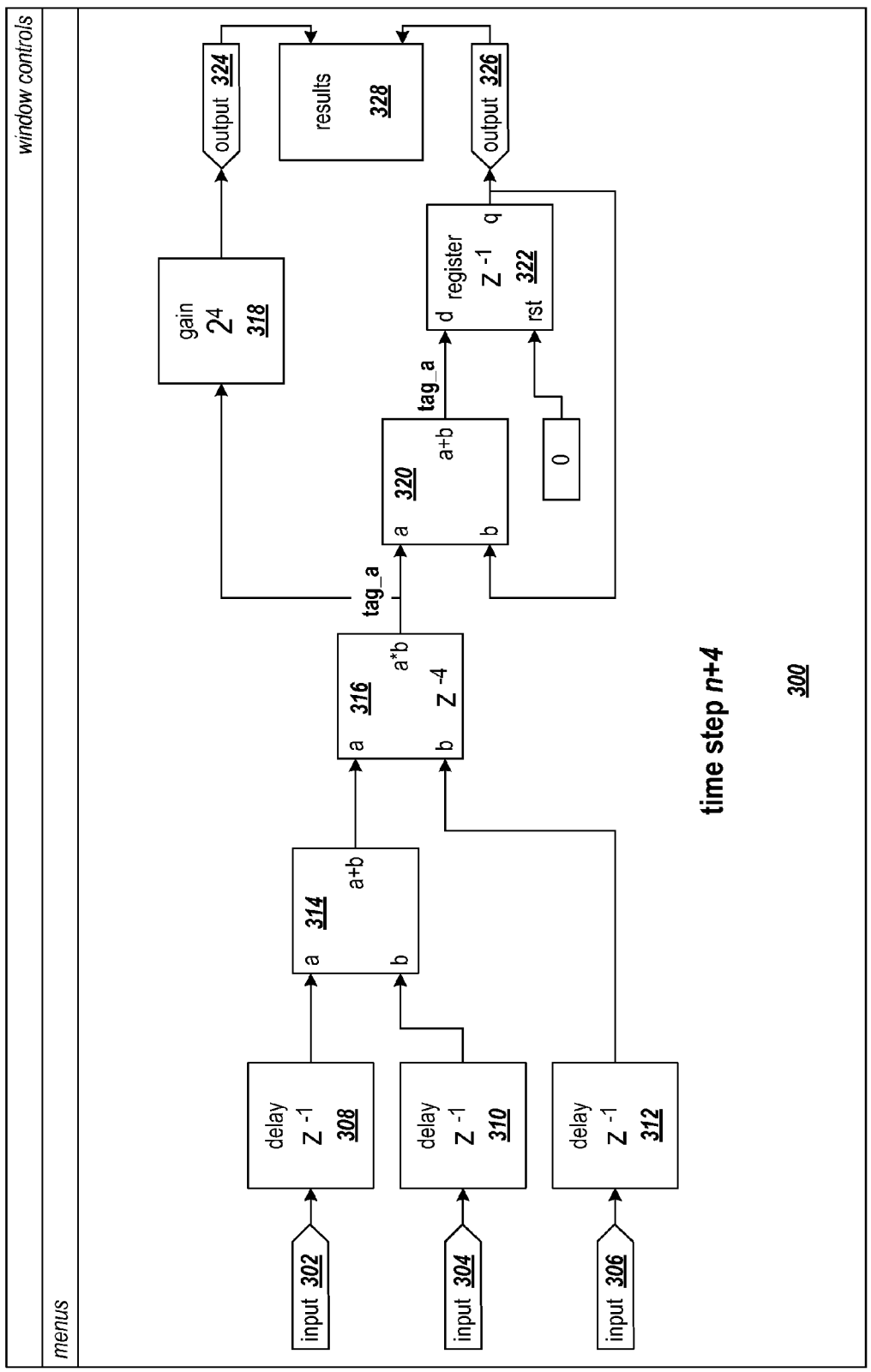
FIG. 4 shows the block diagram during the simulation at time step n+4.
Figure 5:
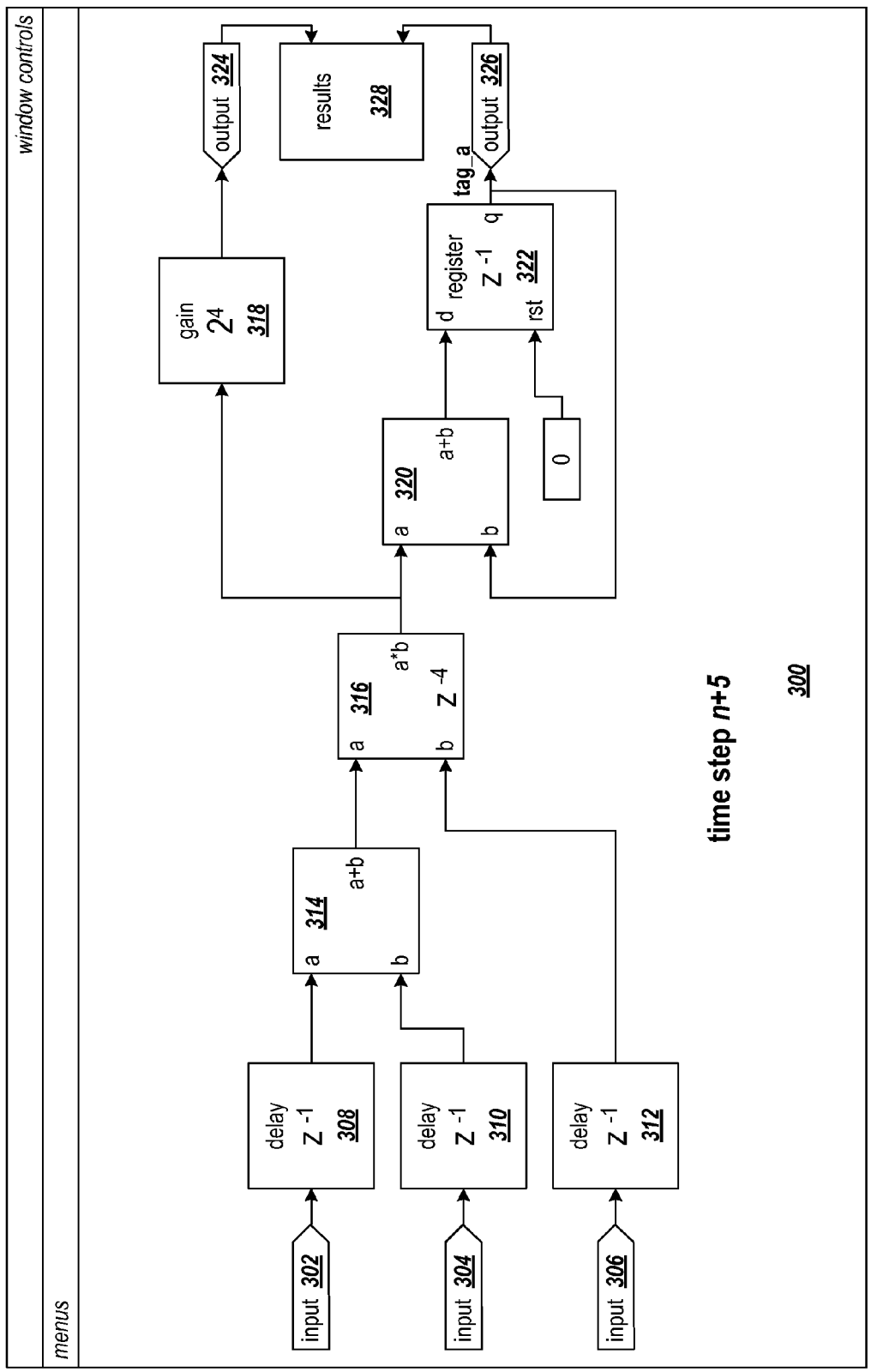
FIG. 5 shows the block diagram during the simulation at time step n+5.

FIGS. 3-5 contain screen shots taken at three times during simulation of an example circuit. The example screen shots show tagging of output data from simulated sub-circuits of the design. FIG. 3 shows the block diagram during the simulation at time step n, FIG. 4 shows the block diagram during the simulation at time step n+4, and FIG. 5 shows the block diagram during the simulation at time step n+5.

The block diagram shows a circuit having input ports 302, 304, and 306. The input ports are connected to respective delay circuits 308, 310, and 312. Delay circuits 308 and 310 provide inputs to adder 314, and the outputs of adder 314 and delay circuit 312 provide inputs to multiplier 316. The output of multiplier 316 provides the input to gain circuit 318, which in turn provides output to output port 324. The output of multiplier 316 is also provided as one of the inputs to adder 320, which receives its other input as feedback from delay register 322. Delay register has its data input connected to the output of the adder 320 and a reset port connected to a register held at 0. The output of the register 322 is connected to output port 326, which along with output port 324, provides results 328.

During simulation at time step n, the output value of adder 314 is computed and provided to multiplier 316. Concurrent with computing the output data value of adder 314, the associated tag value is generated. In one embodiment, tags can be programmatically inserted by any of the blocks based on certain conditions. For example, the condition set could be quantization overflow and the tagging would permit the user to temporally observe the effect of the overflow as the overflow data moves through the design. In another example embodiment in which the hand-off scheme is used, the computed tag value is the union of the tag values associated with the signals at input ports a and b of the adder 314. Concurrent with providing the data value to the multiplier 316, the tag value tag_a is displayed near the signal line connecting the adder and multiplier. In this manner the user is able to observe the flow of data through the block diagram. While actual signal values could be displayed in association with block outputs, displaying actual signal values at all locations could slow down the simulation. Also, limiting the display to tag values allows one to focus on specific areas of interest as marked by non-null tag values.

FIG. 4 shows the block diagram of FIG. 3 at time step n+4 in the simulation. Since the multiplier 316 incurs a delay of 4 time steps from the input of data to the output of value data, tag_a is not displayed at the output of the multiplier until time step n+4. Note that the tag value tag_a is also displayed at the output of adder 320 during time step n+4. Since the adder does not incur any delay in computing the sum, the tag value is available at the output of adder 320 during the same simulation time step as the tag value is available at the output of the multiplier 316.

FIG. 5 shows the block diagram of FIG. 3 at time step n+5 in the simulation. At time step n+5, the tag value tag_a is displayed at the output of register 322, which introduced a delay of one time step in the data path.

Figure 6:
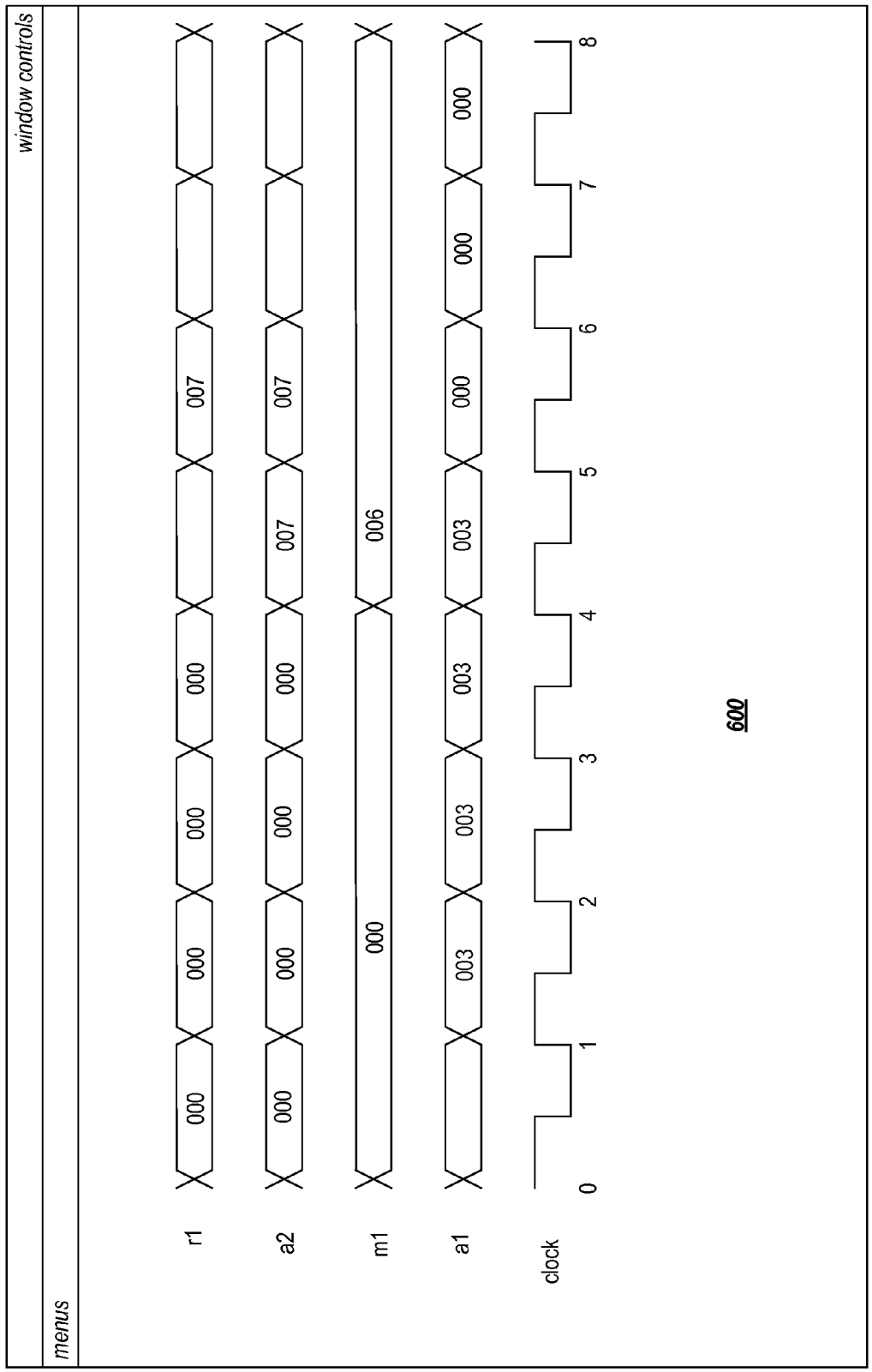
FIG. 6 shows a waveform view of the simulation depicted in FIGS. 3-5.

FIG. 6 shows a waveform view of the simulation depicted in FIGS. 3-5 and illustrates how the simulation views presented in the embodiments of the present invention aid in observing circuit behavior during simulation. In simulating complex circuits it may be difficult to trace the flow of data through the different components of a design when relying on a waveform view such as that illustrated in FIG. 6. The designer may have to cross reference between the waveform view and the system design to perform diagnostics and debugging.

Correlating the data in the waveform with design blocks may be difficult since the names of the data values in the waveform may not explicitly indicate the logic blocks from which the data were generated. For example, the data values are labeled a1, m1, a2, and r1. Though these labels correspond to the outputs of adder 314, multiplier 316, adder 320, and register 322, respectively, it may be difficult in many cases to draw the correspondences and then correlate the output values to the flow of data through the design.

Figure 7:
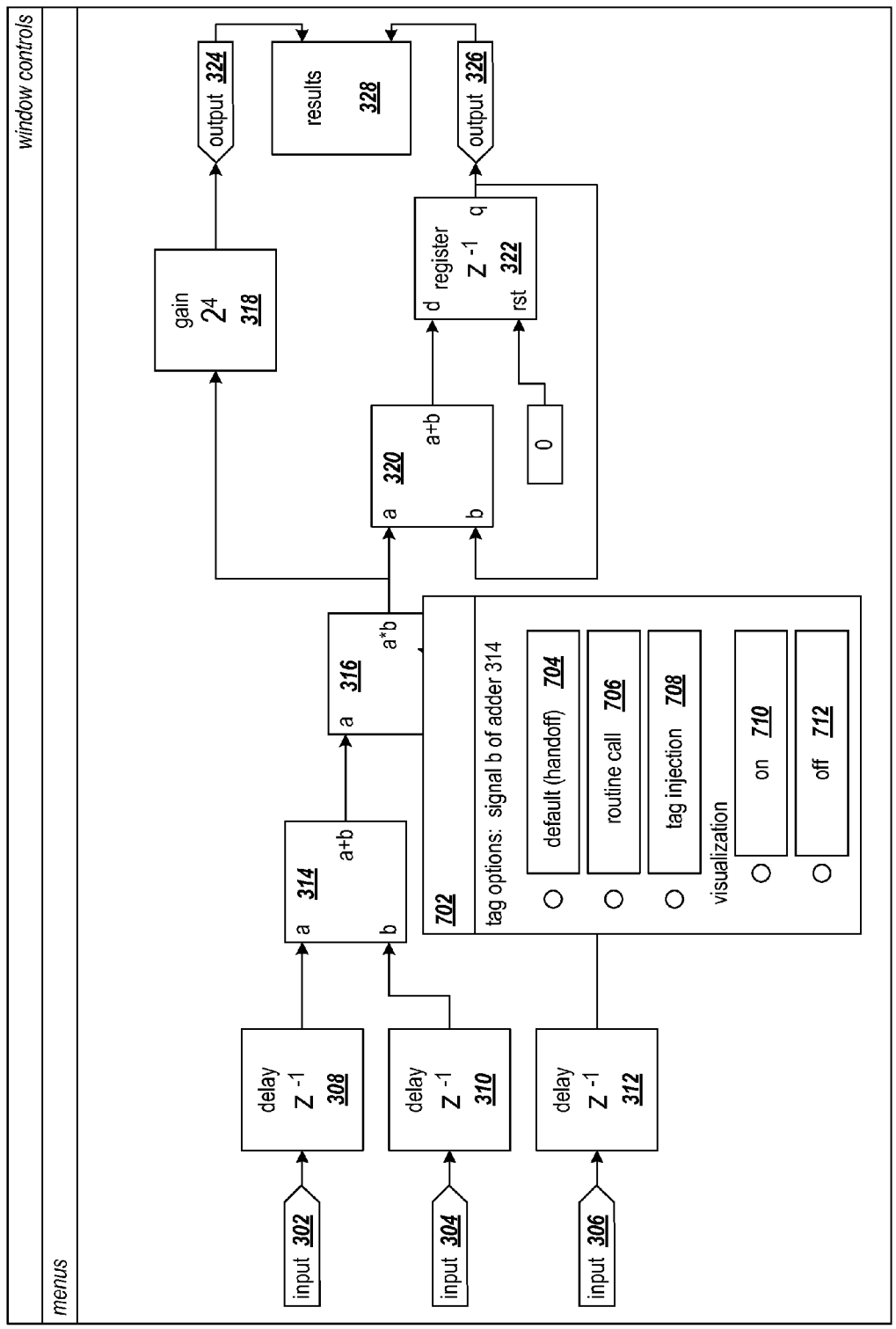
FIG. 7 is a screen shot that shows an example interface for selecting the scheme for defining a tag for a selected signal.

FIG. 7 is a screen shot that shows an example interface for selecting the scheme for defining a tag for a selected signal. In the example, the signal b of adder 314 has been chosen. According to one embodiment, there are three options for defining the tag on a signal. Each option is selectable with an association selection button.

In the default approach (block 704), the input tag value is handed off or carried forward to the next instance where a tag is to be determined. In the example adder 314, the tag is carried forward and used in determining the value of the tag for the output signal (a+b) from the adder.

In the routine call approach (block 706), the designer specifies a routine to be called when a signal is updated. For an input signal, such as b, the routine call approach may not be applicable. The routine call would be applicable for the output signal a+b of the adder. The routine may be specified as a path name of the routine to be called.

In the tag injection approach (block 708), the designer specifies an expression that is parsed with each simulation cycle. A tag is injected into the simulation for the signal based on the evaluation of the expression. The expression may include input and output tag values of the block in combination with input and output data values of the block.

In another embodiment, the display of individual tags during simulation may be controlled. The user can specify which tag values are to be displayed in different portions of the block diagram and design. For example, the user may designate tag_a to be visible and tag_b to be hidden in a first portion of the block diagram, and designate tag_b to be visible and tag_a to be hidden in a first portion of the block diagram. The visualization property is selectable with buttons associated with on and off selections (710 and 712).

The present invention is thought to be applicable to a variety of systems for simulating electronic circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of simulating a circuit design, comprising:
    displaying a block diagram of the circuit design, each block corresponding to one of a plurality of sub-circuits of the circuit design, each block having at least one input and at least one output, and at least one of the input or output of each block being connected to another block;
    inputting simulation input data to a simulation model of the circuit design; and
    during simulation on a computer system of each of a plurality of the sub-circuits with the simulation model, performing steps including:
        determining an output data value from one or more input data values to the simulated sub-circuit;
        concurrent with determining the output data value, determining an output tag value corresponding to the output data value; and
        displaying each output tag value proximate an output signal line from the block corresponding to the sub-circuit and concurrent with output of the output data value from the simulated sub-circuit;
        wherein each output tag value is displayed at a time responsive to the corresponding output data value being changed during simulation.

2. The method of claim 1, wherein the determining of the output tag value determines the output tag value as a function of one or more input tag values associated with the one or more input data values.

3. The method of claim 1, wherein for a sub-circuit that is a data storage element, the determining of the output tag value includes assigning a NULL value to the output tag value in response to a reset of the simulated data storage element, and for an output tag value that is NULL, the displaying includes not displaying an output tag value proximate the output signal line from the block corresponding to the data storage element.

4. The method of claim 1, wherein the one or more input data values include two or more input data values, and the determining of the output tag value determines the output tag value to be a union of two or more input tag values associated with the two or more input data values.

5. The method of claim 4, further comprising:
    wherein the outputs of the plurality of sub-circuits have associated output tag values;
    initializing the output tag values associated with the outputs of the plurality of sub-circuits to NULL values;
    wherein an output tag value from a first simulated sub-circuit is an input tag value to a second simulated sub-circuit that is connected to the first simulated sub-circuit; and
    wherein for an output tag value that is NULL for a simulated sub-circuit, the displaying includes not displaying an output tag value proximate the output signal line from the block corresponding to the simulated sub-circuit.

6. The method of claim 5, further comprising:
wherein the union of a first input tag value that is non-NULL and a second input tag value that is NULL is the non-NULL value.

7. The method of claim 6, further comprising:
wherein the union of a third input tag value that is non-NULL and a fourth input tag value that is non-NULL is a fifth non-NULL value that is not equal to either the third or fourth non-NULL values; and
storing a mapping of the fifth non-NULL value to the third and fourth non-NULL values.

8. The method of claim 1, further comprising:
wherein the determining of the output tag value includes invoking a function associated with the output of the sub-circuit when the output data value is determined during simulation; and
the associated function generates the output tag value as a function of at least one of the input data values.

9. The method of claim 1, wherein:
the one or more input data values include two or more input data values;
the determining of the output tag value for an output designated with default tag handling, determines the output tag value to be a union of two or more input tag values associated with the two or more input data values; and
the determining of the output tag value for an output of at least one simulated sub-circuit designated with user-defined tag handling, determines the output tag value to be a user-specified value in response to at least one input data value to the at least one simulated sub-circuit.

10. A system for simulating a circuit design, comprising:
a processor; and
a memory arrangement coupled to the processor, wherein the memory is configured with instructions that are executable by the processor, and when executed by the processor the instructions causing the processor to perform operations including:
displaying a block diagram of the circuit design, each block corresponding to one of a plurality of sub-circuits of the circuit design, each block having at least one input and at least one output, and at least one of the input or output of each block being connected to another block;
inputting simulation input data to a simulation model of the circuit design; and
during simulation of each of a plurality of the sub-circuits with the simulation model, performing steps including:
determining an output data value from one or more input data values to the simulated sub-circuit;
concurrent with determining the output data value, determining an output tag value corresponding to the output data value; and
displaying each output tag value proximate an output signal line from the block corresponding to the sub-circuit and concurrent with output of the output data value from the simulated sub-circuit;
wherein each output tag value is displayed at a time responsive to the corresponding output data value being changed during simulation.

11. The system of claim 10, wherein the determining of the output tag value determines the output tag value as a function of one or more input tag values associated with the one or more input data values.

12. The system of claim 10, wherein for a sub-circuit that is a data storage element, the determining of the output tag value includes assigning a NULL value to the output tag value in response to a reset of the simulated data storage element, and for an output tag value that is NULL, the displaying includes not displaying an output tag value proximate the output signal line from the block corresponding to the data storage element.

13. The system of claim 10, wherein the one or more input data values include two or more input data values, and the determining of the output tag value determines the output tag value to be a union of two or more input tag values associated with the two or more input data values.

14. The system of claim 13, the operations further including:
wherein the outputs of the plurality of sub-circuits have associated output tag values;
initializing the output tag values associated with the outputs of the plurality of sub-circuits to NULL values;
wherein an output tag value from a first simulated sub-circuit is an input tag value to a second simulated sub-circuit that is connected to the first simulated sub-circuit; and
wherein for an output tag value that is NULL for a simulated sub-circuit, the displaying includes not displaying an output tag value proximate the output signal line from the block corresponding to the simulated sub-circuit.

15. The system of claim 14, the operations further including:
wherein the union of a first input tag value that is non-NULL and a second input tag value that is NULL is the non-NULL value.

16. The system of claim 15, the operations further including:
wherein the union of a third input tag value that is non-NULL and a fourth input tag value that is non-NULL is a fifth non-NULL value that is not equal to either the third or fourth non-NULL values; and
storing a mapping of the fifth non-NULL value to the third and fourth non-NULL values.

17. The system of claim 10, the operations further including:
wherein the determining of the output tag value includes invoking a function associated with the output of the sub-circuit when the output data value is determined during simulation; and
the associated function generates the output tag value as a function of at least one of the input data values.

18. The system of claim 10, the operations further including:
wherein the determining of the output tag value for an output designated with default tag handling, determines the output tag value to be a union of two or more input tag values associated with the one or more input data values; and
wherein the determining of the output tag value for an output of at least one simulated sub-circuit designated with user-defined tag handling, determines the output tag value to be a user-specified value in response to at least one input data value.

19. An article of manufacture, comprising:
a non-transitory processor-readable storage device configured with program instructions that when executed by one or more processors cause the one or more processors to perform operations including:
displaying a block diagram of the circuit design, each block corresponding to one of a plurality of sub-circuits of the circuit design, each block having at least one input and at least one output, and at least one of the input or output of each block being connected to another block;

inputting simulation input data to a simulation model of the circuit design; and during simulation of each of a plurality of the sub-circuits with the simulation model, performing steps including:
- determining an output data value from one or more input data values to the simulated sub-circuit;
- concurrent with determining the output data value, determining an output tag value corresponding to the output data value; and
- displaying each output tag value proximate an output signal line from the block corresponding to the sub-circuit and concurrent with output of the output data value from the simulated sub-circuit;

wherein each output tag value is displayed at a time responsive to the corresponding output data value being changed during simulation.

* * * * *